US00RE41690E

(19) United States
(12) Reissued Patent
Zhang

(10) Patent Number: US RE41,690 E
(45) Date of Reissued Patent: *Sep. 14, 2010

(54) LASER PROCESSING METHOD

(75) Inventor: Hongyong Zhang, Atsugi (JP)

(73) Assignee: Semiconductor Energy Laboratory Co., Ltd., Atsugi-shi, Kanagawa-ken (JP)

( * ) Notice: This patent is subject to a terminal disclaimer.

(21) Appl. No.: 09/860,499

(22) Filed: May 21, 2001

(Under 37 CFR 1.47)

Related U.S. Patent Documents

Reissue of:

(64) Patent No.: 5,533,040
Issued: Jul. 2, 1996
Appl. No.: 08/138,066
Filed: Oct. 20, 1993

U.S. Applications:

(62) Division of application No. 09/109,157, filed on Jul. 2, 1998, now Pat. No. Re. 37,993.

(30) Foreign Application Priority Data

Oct. 21, 1992 (JP) ..... 4-307797

(51) Int. Cl.

| | |
|---|---|
| ***H01S 3/10*** | (2006.01) |
| ***H01S 3/13*** | (2006.01) |
| ***H01S 3/30*** | (2006.01) |
| ***H01S 3/00*** | (2006.01) |

(52) U.S. Cl. ..... 372/25; 372/7; 372/30; 372/109

(58) Field of Classification Search ..... 372/7, 372/25, 30, 109, 66, 69, 70, 87, 92, 98; 438/149, 438/166, 486, 487; 257/E21.133, E21.134
See application file for complete search history.

(56) References Cited

U.S. PATENT DOCUMENTS

| | | | | | |
|---|---|---|---|---|---|
| 4,375,685 | A | | 3/1983 | LeGoff et al. | |
| 4,547,883 | A | | 10/1985 | Cohn et al. | |
| 4,606,034 | A | | 8/1986 | Eden et al. | |
| 5,132,754 | A | * | 7/1992 | Serikawa et al. | 257/57 |
| 5,145,808 | A | | 9/1992 | Sameshima et al. | |
| 5,231,297 | A | * | 7/1993 | Nakayama et al. | 257/77 |
| 5,365,875 | A | * | 11/1994 | Asai et al. | 438/487 |
| 5,409,857 | A | * | 4/1995 | Watanabe et al. | 438/158 |
| 5,533,040 | A | | 7/1996 | Zhang | |
| RE37,993 | E | * | 2/2003 | Zhang | 372/25 |

FOREIGN PATENT DOCUMENTS

| | | |
|---|---|---|
| JP | 63-105970 | 5/1988 |
| JP | 01-145532 | 6/1989 |
| JP | 04-102311 | 4/1992 |
| JP | 04-267578 | 9/1992 |

* cited by examiner

*Primary Examiner*—Armando Rodriguez
(74) *Attorney, Agent, or Firm*—Eric J. Robinson; Robinson Intellectual Property Law Office, P.C.

(57) ABSTRACT

Method of processing, e.g., laser annealing, objects such as semiconductor devices with pulsed lasers with high production yield and high reproducibility so as to obtain good characteristics stably. The pulse width of the irradiated pulse beam is set to more than 30 nsec to stabilize the processing. To achieve a pulse width exceeding 30 nsec, plural lasers are connected in series or in parallel and excited successively.

16 Claims, 3 Drawing Sheets

FIG. 3
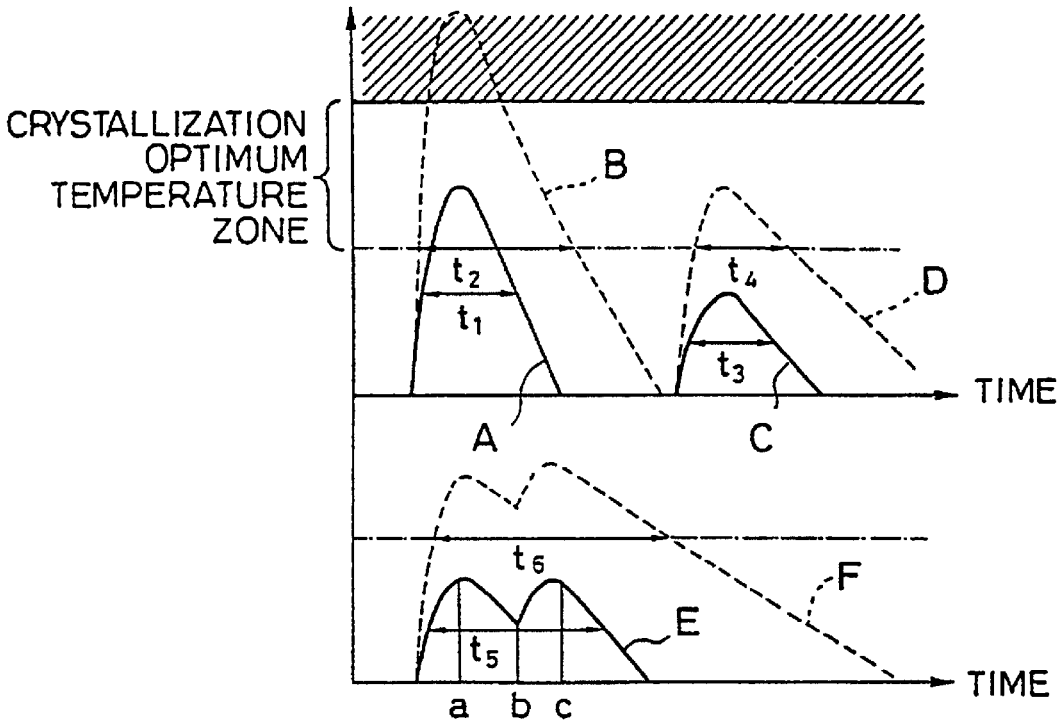
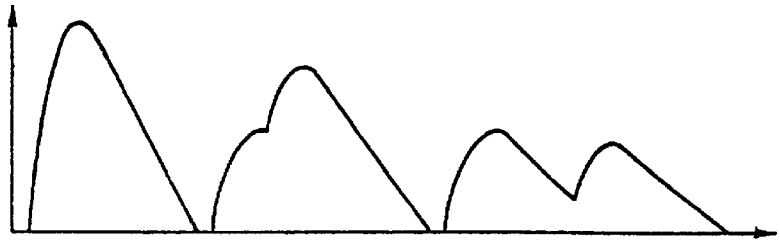
FIG. 4(a) FIG. 4(b) FIG. 4(c)
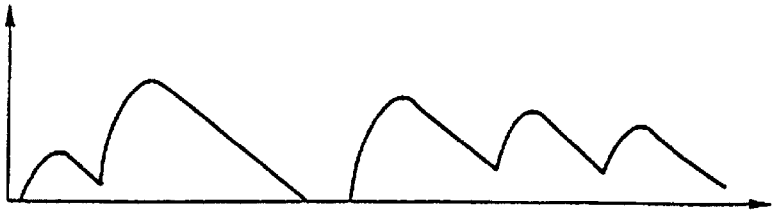
FIG. 4(d) FIG. 4(e)

LASER PROCESSING METHOD

Matter enclosed in heavy brackets [ ] appears in the original patent but forms no part of this reissue specification; matter printed in italics indicates the additions made by reissue.

*This divisional application is based upon Reissue application Ser. No. 09/109,157 filed Jul. 2, 1998 which is based upon U.S. Pat. No. 5,533,040 issued on Jul. 2, 1996.*

FIELD OF THE INVENTION

The present invention relates to a laser beam machining process for annealing workpieces with high reliability, high throughput, high uniformity and a high production yield. More particularly, the invention relates to a method of laser annealing various materials including amorphous semiconductor materials, semiconductor materials of low crystallinity equivalent to amorphous semiconductor materials, metal materials, insulator materials, and various materials whose crystallinity has been severely deteriorated by ion irradiation, ion implantation, ion doping, or other similar method. Also, the invention relates to a method of doping a material with an impurity element by high temperatures created by laser irradiation.

BACKGROUND OF THE INVENTION

In recent years, researches on low-temperature semiconductor fabrication processes have been earnestly conducted, because it is necessary to form semiconductor devices on an insulating substrate made of glass or the like or on an insulating coating formed on the semiconductor substrate and fur other reasons. To fabricate these, semiconductor devices, it has been necessary to thermally treat them. For example, in order to thermally crystallize a semiconductor coating which takes an amorphous state or a low crystallinity equivalent to the amorphous state, or to reduce unpaired electrons, or dangling bonds, in insulating films and semiconductor films, a thermal treatment performed at approximately 1000° C. is needed.

However, where devices are formed on a glass substrate, it is necessary that the glass substrate withstand such high-temperature thermal treatment. Where semiconductor devices are formed on a semiconductor substrate, i.e., plural layers of semiconductor are formed, if the lower layer of devices has conductive interconnects of a low-melting metal, then it is not possible to perform a high-temperature treatment.

Accordingly, methods (Including laser annealing) of creating a requisite local high-temperature state by laser irradiation in such a way that neither the substrate nor other conductive interconnects are damaged have attracted attention as ideal low-temperature processes. Especially, irradiation of short laser pulses less than 1 μsec is an ideal method because other portions are hardly affected by conduction of heat. Among others, the use of an excimer laser emitting ultraviolet radiation has been considered to be most practical, because ultraviolet radiation is efficiently absorbed by many materials and because a large energy can be obtained.

However, severe laser processing conditions have heretofore existed. In consequence, laser processing techniques are far from stable techniques and do not provide sufficiently high reliability. Hence, it has generally been considered that laser processing techniques will never be put into practical use.

SUMMARY OF THE INVENTION

It is an object of the present invention to provide a laser processing technique which Is an improvement over the prior an laser processing techniques and makes it possible to obtain stable requisite characteristics.

It is another object of the invention to provide a laser treatment method which can be applied to low-temperature semiconductor fabrication processes Other objects and features of the invention will appear in the course or the description thereof, which follows.

A laser processing method in accordance with the present invention comprises the steps of:

lasing a laser pulse having a pulse width w by a lasing device, and amplifying laid laser pulse by exciting a laser amplifier after 0.5 W to 5 W since said lasing step.

The laser pulse is irradiated to a surface to be processed through the laser amplifier. For example, the laser pulse is irradiated to a silicon semiconductor containing hydrogen at 1 volume % or more through the laser amplifier.

BRIEF DESCRIPTION OF THE DRAWINGS

FIG. 3 is a graph illustrating the shapes of laser pulses (indicated by the solid lines) utilized respectively by a laser treatment method according to the invention and by the prior art laser treatment method, as well as temperature variations of illuminated surfaces (indicated by the broken lines);

FIGS. 4(a) to 4(e) are graphs illustrating laser pulses utilized by a method according to the invention;

DETAILED DESCRIPTION OF THE INVENTION

Figure 1:
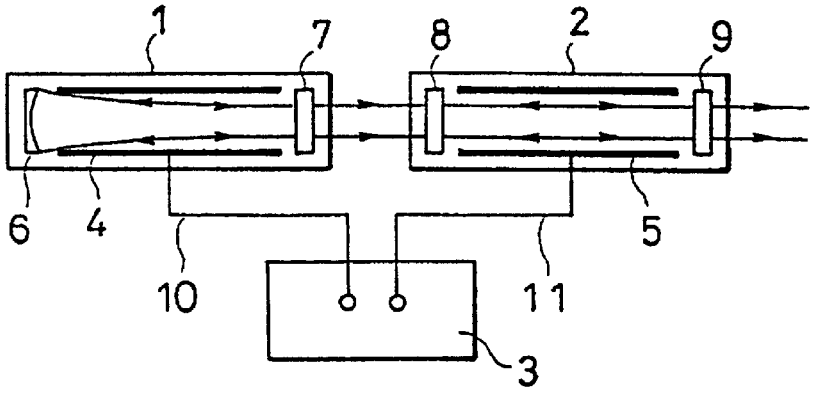
FIG. 1 is a conceptual diagram of a laser treatment apparatus according to the invention.

Referring to FIG. 1, there is shown a laser treatment apparatus according to the present invention. This apparatus comprises at least two stages of lasers, i.e., a lasing device 1 and at least one stage of amplifier (laser amplifier) 2. A trigger pulse-generating circuit 3 drives these lasers in synchronism. Alternatively, a circuit is provided which has the same function as the pulse-generating circuit 3 and controls the lasers. The lasing device 1 and the amplifier (laser amplifier) 2 are connected with the trigger pulse-generating circuit (trigger pulse generation means) 3 via cables 10 and 11, respectively.

The lasers 1 and 2 are equipped with exciting devices 4 and 5, respectively, each of which includes a discharge electrode and a flashlamp. These exalting devices 4 and 5 produce electric discharge or emit light in response to a signal from the trigger pulse-generating circuit 3. The produced discharge or light writes a later medium contained in each laser.

The lasing device 1 has totally reflecting mirror 6 and a half mirror 7. Coherent light generated inside the laser medium is partially resonated and amplified by these mirrors 6 and 7. The resonator of the lasing device is shown to be of the semi-confocal type. However, the resonator of the lasing device may also be of the parallel-plate type, confocal type, or unstable type. The resonator of the amplifier 2 is designed similarly but the feedback ratio of the amplifier 2 is required to be set to a low value. If the feedback ratio is large, spontaneous lasing takes place when the laser medium is excited.

The amplifier 2 has optical elements 8 and 9 each of width made of a half mirror or an ordinary transparent material. It is necessary that these optical elements 8 and 9 transmit a laser beam guided to these devices mainly from the losing device 1. The amplifier 2 amplifies the laser beam generated by the lasing device 1.

Figure 2A:
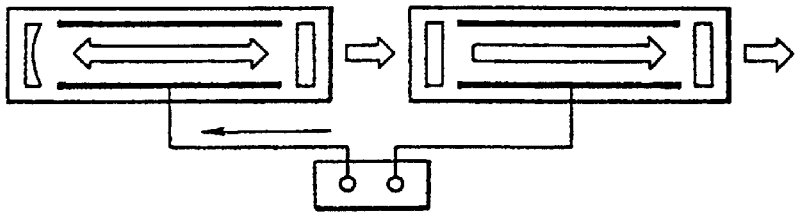
FIGS. 2(A) to 2(C) are conceptual diagrams similar to FIG. 1, but showing various modes of operation of the laser treatment apparatus according to the invention.
Figure 2B:
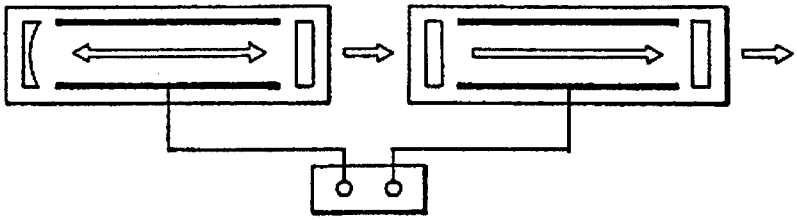
Figure 2C:
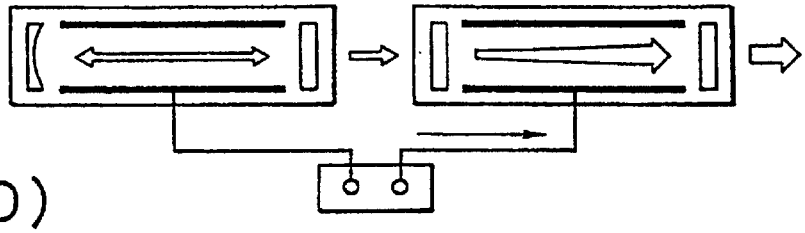
Figure 2D:
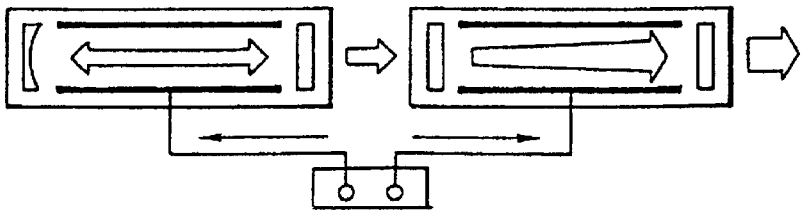
FIG. 2(D) PRIOR ART
FIG. 2(D) is a conceptual diagram of the prior art laser treatment apparatus, illustrating its operation.

In this apparatus, it is common practice to excite the lasing device 1 and the amplifier 2 substantially simultaneously, i.e., with step out less than half of die laser pulse width. The laser pulse width referred to herein is the half-value width of a pulse, in the case of an excimer laser, the step out is typically less than 10 nsec. In this synchronization method, the obtained laser pulse is a single pulse having a large pulse height, or a large maximum power. More specifically, as shown in FIG. 2(D), a laser pulse generated by the lasing device is directly amplified by the amplifier. The final pulse height is the product of the output from the lasing device and the gain of the amplifier.

FIG. 3 illustrates the shapes of various laser pulses and variations in the temperatures of object surfaces illuminated with the laser pulses, Laser pulses obtained by the prior art synchronization method are indicated by the solid Hues A and C. The resulting temperature variations are indicated by the broken lines B and D. Although pulse A is higher than pulse C, their pulse widths are substantially the same, i.e., $t_1 \approx t_3$.

In order to treat object surfaces with these pulses, it is also necessary to take account of other conditions. For example, where amorphous silicon is crystallized by laser irradiation, if a temperature rise caused by the laser irradiation is insufficient or excessive, then satisfactory characteristics cannot be obtained. Also, die duration of the optimum temperature should not be too short.

For example, in the case of the pulse A, a large temperature rise is caused because the pulse height is large. Therefore, the duration of the lowest possible temperature (indicated by the phantom line) necessary for crystallization is $t_2$, which is longer than the duration in the ease of the pulse C. However, the upper limit of the temperature optimum for crystallization is exceeded for a greater part of the duration. Under this condition, the object is melted by heating. Crystallization occurs only during a short time between the instant when the melted state takes place and the instant when the temperature optimum for crystallization is reached. In this way, the time used for crystallization is quite short.

On the other hand, in the case of the pulse C, the illuminated surface is not melted because the pulse height is low. However, the time $t_4$ within the crystallization optimum temperature zone is short.

Ideally, the pulse height is located within the crystallization optimum temperature zone, and the pulse width is lengthened so that a more time may lie within the zone. Preferably, the pulse width is set to more than 30 nsec, more preferably more than 100 nsec if possible, in order to crystalline amorphous silicon semiconductor or silicon semiconductor having low crystallinity equivalent to on amorphous state. The pulse height can be adjusted by increasing and decreasing the power density by optical elements. However, it is difficult to adjust the pulse width because it is intrinsic in the laser. Only one feasible method it to modify electrical discharge state by changing the electrode structure or by other contrivances.

To solve this problem, the lasing device and the amplifier are pulled out of synchronization according to the present invention. Under this condition, plural pulses are mixed to substantially lengthen the pulse width. Appropriate step out is 0.5 to 5 times as long as the pulse width.

The principle of the present invention is described now by referring to FIG. 2, (A)–(D). As shown in FIG. 2(A), a trigger pulse generated by the trigger pulse generation means is first applied only to the lasing device. As a result, laser radiation is produced inside the lasing device and propagates toward the amplifier. Since no trigger pulse is applied to the amplifier, the laser medium inside the amplifier is not in on excited state. Therefore, the laser radiation entering the amplifier is transmitted through the amplifier without being amplified. Especially, where a rare gas dimer excimer or rare gas halide excimer is used as the laser medium, radiation coming from the lasing device propagates through the laser medium in such a way that it is hardly absorbed (or attenuated) because the excimer has no ground state. This is quite advantageous. The output rises as indicated by solid line E in FIG. 3 and assumes its maximum value at point a.

After a time, the laser radiation resonating inside the lasing device attenuates. Under this condition, laser radiation entering the amplifier passes through it as it is (FIG. 2(B)). At point b on the curve E indicated by the solid line, a trigger pulse generated by the trigger pulse generation means is applied only to the amplifier (laser amplifier) as shown in FIG. 2(C). Weak laser radiation remaining in the lasing device is amplified by the amplifier and takes its maximum value at point c on the curve E.

As a result, the laser pulse has two peaks. The substantial laser pulse width indicated by $t_5$ is lengthened. The temperature of the illuminated surface varies as indicated by curve P indicated by the broken line. Hence, the time lying within the crystallization optimum temperature zone can be increased.

The shape of the laser pulse can be changed with comparatively great freedom, depending on the degree of step out and on the intensity of excitation of the amplifier. Examples of this are shown in FIG. 4, (a)–(e). FIG. 4(a) shows a case in which the lasing device and the amplifier are substantially synchronized to each other. The produced pulse is a single pulse having a large pulse height.

FIG. 4(b) shows a case in which the amplifier is excited when the duration of the laser pulse width has passed since the lasing device has lapsed. FIG. 4(c) shows a case in which the amplifier is excited when a duration about twice as long as the laser pulse width has elapsed since the lasing device has lapsed.

FIG. 4(d) shows a case in which the lasing device is excited weakly but me amplifier it excited strongly after a duration about twice as long as die laser pulse width has elapsed suite the lasing device has lased. In this pulse scheme, processing requiring a comparatively small energy is performed at a first low pulse. Processing requiring a large energy is performed at the next large pulse. For example, where an amorphous silicon film containing a large amount of hydrogen should be crystallized, if laser radiation having a large energy is irradiated at first, then the contained hydrogen expands rapidly, thus destroying the film. For this reason, laser radiation of a low energy is irradiated at first to drive off the hydrogen. Then, a pulse having en energy sufficient for crystallization it irradiated, for conducting the crystallization. In the prior art techniques, this step has been carried out by illuminating two pulses. In the present invention, a pulse as shown in FIG. 4(d) is created and irradiated. Thus, only one pulse irradiation suffices.

In the examples described thus far, two stages of lasers are used. FIG. 4(e) shows a case in which three lasers are employed. The substantial pulse widen can be increased further by connecting more stages of lasers.

Figure 5:
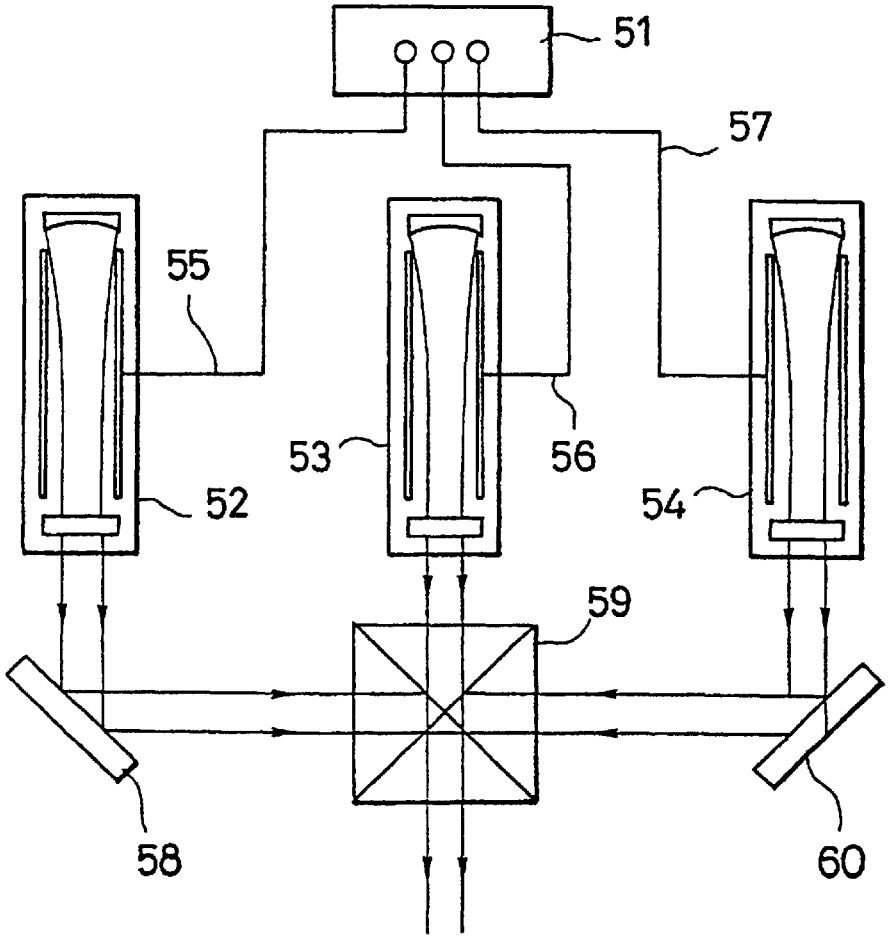
FIG. 5 is a conceptual diagram of a laser treatment apparatus according to the invention.

A second example of laser treatment method according to the present invention is illustrated in FIG. 5, where plural lasers connected in parallel and acting as lasing devices are used. The shape of the laser pulse can be arbitrarily modified as shown in FIG. 4, (a)–(e), by adjusting the synchronization of the excitation and lading of these lasers. In this manner, the substantial pulse width can be optimized.

Specifically, in FIG. 5, three lasing devices 52, 53, and 54 are connected in parallel. Output beams from these lasing devices are combined into one by mirrors 58, 59, and 60 and directed to a surface to be illuminated. The lasing devices 52, 53, and 54 are connected wild a control unit 51 consisting of a trigger pulse-generating circuit by cables 55, 56, and 57, respectively. Thus, the timing of their lasing is controlled.

Figure 6:
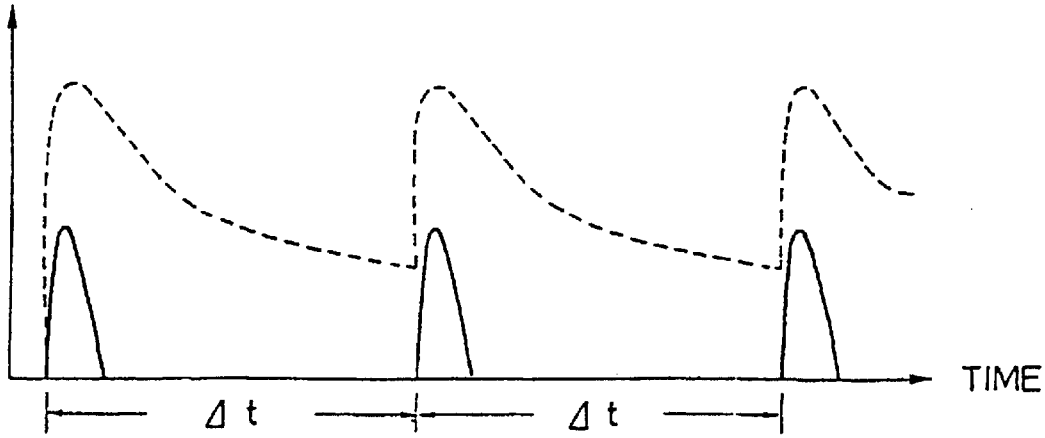
FIG. 6 is a graph illustrating laser pulses utilized by a method according to the invention.

In this method, the lasing devices undergo lasing independently and so plural discrete laser pulses can be utilized. Examples of these pulses are shown in FIG. 6. For example, the interval Δt between successive pulses may be made uniform or nonuniform. In FIG. 6, the solid lines indicate changes in the energy of the pulses. The broken line indicates variations in the temperature of the illuminated our face. Where the illuminated surface is maintained above 250° C. and laser irradiation is carried out with Δt=50 to 200 nsec, the illuminated surface is kept at between 500° to 1000° C. for a quite long time. In this method, however, the plural laser beams must be converged into one. Especially, the use of intense laser beams mates it difficult to design the half mirror 59 and so on.

In the present invention, lasers adapted for mass production are preferably used. Examples include Nd: YAG lasers (1.06 μm), carbon dioxide gas lasers emitting infrared radiation, and excimer lasers emitting ultraviolet radiation. When a laser is selected from those lasers, the absorption coefficient of the illuminated surface for the laser beams is taken into account. Usable excimer lasers are $Ar_2$ laser (126 nm), $Kr_2$ laser (146 nm), $Xe_2$ laser (172 nm), ArF laser (193 nm), KrCl laser (222 nm), KrF laser (248 nm), XeCl laser (308 nm), and XeF laser (351 nm).

Intrinsically, an excimer laser has a short pulse width because the life of the excimer acting as a laser medium is short. In particular, a transition from an excited state to a ground state emits light lying in the ultraviolet region and so the energy is very large. The life of an excited state is in proportion to the cube of the transition energy provided that the other conditions are the same. Accordingly, a laser pulse having a shorter wavelength tends to have a shorter pulse width. Conversely, on excimer laser pulse having a longer wavelength has a longer pulse width. For example, an XeFe laser pulse has a long pulse width of about 40 nsec for the reason described above. Therefore, the invention permits a further increase in the substantial pulse width. Hence, a further advantage can be derived. However, since the lasing wavelength is increased, the usage conditions are restricted.

EXAMPLE 1

A silicon oxide film having a thickness of 100 nm was formed on an insulating substrate of Corning 7059 glass by sputtering. Silicon was deposited as a film having a thickness of 50 to 80 nm on the silicon oxide film from disilane ($Si_2H_6$) by low-pressure CVD. During the growth of this film, the substrate temperature was 150° C. The obtained silicon film had low crystallinity and contained numerous microcrystallites. The hydrogen concentration was 0.5 to 5%.

This silicon mm was irradiated with a laser beam according to the present invention to obtain a silicon film having good crystallinity. A KrF excimer laser was used to emit the laser beam. When it was used alone, the laser pulse width was 17 nsec. Such lasers were connected together and used as a lasing device and an amplifier, respectively. After 15 nsec passed since the lasing device has been excited, the amplifier was excited. A voltage of 37 kV was applied to both lasing device and amplifier. The obtained pulse waveform was similar to the waveshape shown in FIG. 4(C). The pulse width wan about 35 nsec. The energy was 1.1 J per pulse. The laser beam produced in this way was shots of the laser beam were directed to the silicon film. We have observed that the crystallinity of tho silicon film was improved. A thin-film transistor was fabricated from this Silicon film. A high field mobility of more than 150 $cm^2/V.s$ was derived.

In the present example, the substrate temperature when the laser beam was illuminated was room temperature. As described in Japanese Patent Application Ser. No. 100179/1992 filed Mar. 26, 1992, if the substrate is heated at 250° to 500° C., preferably 300° to 400° C., then anticipated results can be easily obtained.

EXAMPLE 2

A silicon oxide film having a thickness of 100 nm was formed on an insulating substrate of Corning 7059 glass by sputtering. Silicon was deposited as a film having a thickness of 50 to 80 nm on the silicon oxide film from monosilane ($SiH_4$) by low-pressure CVD. During the growth of this film, the substrate temperature was 250° C. The obtained silicon film was an amorphous film. The hydrogen concentration was 10 to 30%.

This silicon film was irradiated with a laser beam according to the present invention to obtain a silicon film having good crystallinity. A KrF excimer laser was used to emit the laser beam. When it was used alone, the laser pulse width was 17 nsec. Such lasers were connected together and used as a lasing device and an amplifier (laser amplifier), respectively. After 15 nsec passed since the lasing device has been excited, the amplifier was excited. Voltages of 30 kV and 38 kV were applied to the lasing device and amplifier, respectively, so that a weak pulse might be initially produced (lased) from the lasing device and that the amplifier (laser amplifier) might produce a large pulse output. The obtained pulse waveform was similar to the waveshape shown in FIG. 4(D). The irradiated laser pulse has one peak of a pulse height thereof which is the same as that of the laser pulse as lased by the lasing device, and has another peak of a pulse height following said one peak wherein the pulse height of said one peak is one fourth to one second of the pulse height of said another peak. The pulse width was about 40 nsec. The energy was 650 mJ per pulse. The laser beam produced in this way was magnified by lenses to modify the energy density to 250 to 350 $mJ/cm^2$ preferably 280 to 320 $mJ/cm^2$ Under this condition 5 shots of the laser beam were directed to the silicon film. We have observed that the crystallinity of the silicon film was improved.

Usually, where a silicon film containing a large amount of hydrogen is crystallized by laser irradiation, it is necessary to maintain the temperature of the film at 400° to 450° C. for 2 to 10 hours prior to the laser irradiation or to irradiate a comparatively weak laser beam of 100 to 200 $mJ/cm^2$ for driving off the hydrogen contained in the film. In the present example, the pulse is composed of a weak pulse and a strong pulse. The first weak pulse dissociates hydrogen atoms.

Immediately thereafter, the strong pulse crystallizes the film. A thin-film transistor was fabricated from this silicon film. A high field mobility of more than 150 $cm^2/V.s$ was derived.

EXAMPLE 3

A silicon oxide film having a thickness of 100 nm was formed on an insulating substrate of Corning 7059 glass by sputtering. Silicon was deposited no a film having a thickness of 100 to 150 nm on the silicon oxide film from monosilane ($SiH_4$) by low-pressure CVD. During the growth of this film, the substrate temperature was 250° C. The obtained silicon film was an amorphous film. Finally, silicon oxide was sputtered as a film having a thickness of 10 to 50 nm. The film was allowed to stand within a reducing ambient at 800° C. for 24 hours to crystallize the film. Phosphorus ions or boron ions were implanted into the film at a dosage of $2\times10^{15}$ atoms/$cm^2$ by ion doping. This implantation process deteriorated the crystallinity of the film.

This film was irradiated with a laser beam according to the present invention to recrystallize the film a KrF excimer later was used to emit the laser beam. When it was used alone, the laser pulse width was 17 nsec. Such lasers were connected together and used as a lasing device and an amplifier, respectively. After 15 nsecpassed since the lasing device has been excited, the amplifier was excited. A voltage of 38 kV was applied to both lasing device and amplifier. The waveform of the obtained pulse is similar to the waveshape shown in FIG. 4(C). The pulse width was about 40 nsec. The energy was 1.1 J per pulse. The laser beam produced in this way was magnified by lenses to modify the energy density to 250 to 350 mJ/$cm^2$, preferably 280 in 320 mJ/$cm^2$. Under this condition, 5 shots of the laser beam were directed to the silicon film. We have observed that the crystallinity of the silicon film was improved.

The sheet resistances at 100 locations on the same substrate were measured. We have found that 85% of the measured resistances were below 300 Ω/$cm^2$ and that 95% were below 350 Ω/$cm^2$. All the resistances were below 1 kΩ/$cm^2$. These facts reveal that the present example can greatly reduce defective sheet resistances.

EXAMPLE 4

Silicon oxide was deposited as a film having a thickness of 100 to 150 nm from tetreethoxysilane (TEOS) and oxygen gas on an n-type silicon substrate having a resistivity of 1 to 3 Ωcm by plasma-assisted CVD (chemical vapor deposition). During the growth of this film, the substrate temperature was 250° C. The obtained silicon oxide film contained a large amount of carbon (0.1 to 1%). It was impossible to use this film is a gate oxide film. The silicon oxide film was annealed within an oxidizing ambient above 800° C. to remove carbon atoms. The interface level density could be reduced to such a level that the film could be used as a gate oxide film. In this method, however, it is necessary that the substrate do not shrink in an anneal conducted at 600° C. Non-alkali glasses often used in the prior art techniques do not meet this requirement.

Instead of this method, a method using laser irradiation has been proposed as disclosed in Japanese Patent Application Ser. No. 252296/1992 filed Aug. 27, 1992. However, it has been difficult to obtain optimum conditions with high reproducibility because laser pulses used heretofore have short widths. The present invention overcomes this difficulty by irradiating laser light having a substantially increased pulse width.

The above-described silicon oxide film was irradiated with laser radiation according to the invention to remove (desorb) carbon atoms. An XeF excimer laser was used to emit the laser radiation. When it was used alone, the laser pulse width was 40 nsec. Such lasers were connected together and used as a lasing device and an amplifier, respectively. After 40 nsec passed since the lasing device has been excited, the amplifier was excited. A voltage of 38 kV was applied to both Using device and amplifier. The waveform of the obtained pulse is similar to the waveshape shown in FIG. 4(C). The pulse width was about 80 nsec. The energy was 1.1 J per pulse. The laser beam produced in this way was magnified by lenses to modify the energy density to 200 to 300 mJ/$cm^2$, preferably 250 to 280 mJ/$cm^2$. Under this condition, 5 shots of the laser beam were directed to the silicon oxide film.

Aluminum was deposited as a film on this silicon oxide film by electron-beam evaporation. Measurement of the CV characteristics of the silicon oxide film has shown that good CV characteristics having no hysteresis was obtained. A DC voltage of +17 V or −17 V was applied to the electrode and the substrate at 150° C. for 2 hours. Measurement of CV curve variations has revealed that the variations were within ±0.5 V. As a result, a silicon oxide film having quite excellent characteristics could be obtained.

EXAMPLE 5

A silicon oxide film having a thickness of 100 nm was formed on an insulating substrate of Corning 7039 glass by sputtering. Silicon was deposited as a film having a thickness of 100 to nm on the silicon oxide film from monosilane ($SiH_4$) by low-pressure CVD. During the growth of this film, the substrate temperature was 250° C. The obtained silicon film was an amorphous film. Finally, silicon oxide was sputtered as a film having a thickness of 10 to 50 nm. The film was allowed to stand within a reducing ambient at 600° C. for 24 hours to crystallize the film, and the silicon oxide film on the surface was removed.

This film was then irradiated with a laser beam according to the invention within an ambient of diborane or phosphine in a manner as described in Japanese Parent Application Ser. No. 283981/1991 filed Oct. 1, 1991, to dope the film with an impurity. A KrF excimer laser was used to emit the laser beam. When it was used alone, the laser pulse width was 17 nsec. Three such lasers were arranged in parallel as shown in FIG. 5. These lasers were successively lased at intervals of 80 nsec, for example. A voltages of 38 kV was applied to all of these lasers. The waveform of the obtained pulse is similar to he waveshape in FIG. 8. The laser beam produced in this way was magnified by lenses to modify the energy density to 250 to 350 mJ/$cm^2$ preferably 280 to 320 mJ/$cm^2$ Under this condition, 5 shots of laser beam were directed to the silicon film. We have observed that boron or phosphorus atoms were diffused as an impurity into the silicon film.

The sheet resistances at 100 locations on the some substrate were measured. We have found that 80% of the measured resistances were below 300 Ω/$cm^2$ and that 90% were below 350 Ω/$cm^2$. All the resistances were below 2 kΩ/$cm^2$. These facts reveal that the present example can greatly reduce defective sheet resistances.

As can be understood from the description made thus far, the present invention facilitates handling pulsed lasers, especially excimer lasers, which would have been very difficult to handle in laser annealing and other laser processing. As described in the above examples, the invention enables optimum laser processing such as laser annealing. Hence, highly reliable and uniform semiconductor films can be obtained.

It is to be understood that the above embodiments constitute merely parts of the present invention. Where the invention is combined with various laser mutation techniques disclosed in Japanese Patent Application Ser. Nos. 80800/1991 filed Mar. 18, 1991, 283981/1991 filed Oct. 4, 1991, 290719/1991 filed Oct. 8, 1991, 100479/1992 filed Mar. 26, 1992, 164303/1992 filed May 29, 1992, 237763/1992 filed Aug. 12, 1992, and 252296/1992 filed Aug. 27, 1992, the advantages can be augmented manifold. In this way, the present invention is industrially advantageous.

What is claimed is:

[1. A laser processing method comprising the steps of:

generating a laser pulse from a laser, said laser pulse having a pulse width duration w; and amplifying said laser pulse by the step of activating a laser amplifier at a time t after said generating step, wherein said time t is between about 0.5 times said pulse, width duration w and 5.0 times said pulse width duration w; and processing an object with said laser pulse emitted from said laser amplifier.]

[2. The method of claim 1 wherein said processing stan further comprises the step of irradiating said object with said laser pulse.]

[3. The method of claim 1 wherein said object is a semiconductor which is substantially amorphous.]

[4. The method of claim 1 wherein said object is a substantially amorphous silicon semiconductor containing at least 1 volume % of hydrogen.]

[5. The method of claim 1 further comprising the step of activating said laser by a pulse generated by a trigger pulse-generation means connected to said laser and said laser amplifier.]

[6. The method of claim 1 further comprising the step of activating said laser amplifier by a pulse generated by a trigger pulse generation means connected to said laser and said laser amplifier.]

[7. A laser processing method comprising the steps of:

generating a laser pulse from a laser, said laser pulse having a pulse width duration w;

amplifying said laser pulse by activating a laser amplifier at a time t after said generating step, wherein said time t is between about 0.5 times said pulse width duration w and 5.0 times said pulse width duration w; and processing an amorphous silicon film containing hydrogen at a concentration of 10 to 30% with said laser pulse.]

[8. The method of claim 7 wherein the irradiated laser pulse has one peak of a pulse height thereof which is the same as that of the laser pulse as generated from said laser device, and has another peak of a pulse height following said one peak wherein the pulse height of said one peak is from about 0.25 to 0.50 times the pulse height of said another peak.]

[9. The method of claim 8 wherein said another peak is formed by said amplifying step.]

[10. The method of claim 7 further comprising the step of activating said laser by a pulse generated by a trigger pulse generation means connected to said laser and said laser amplifier.]

[11. The method of claim 7 further comprising the step of activating said laser amplifier by a pulse generated by said trigger pulse generation means connected to said laser and said laser amplifier.]

[12. The method of claim 7 further comprising the step of improving crystallinity of said silicon film by irradiating said silicon film with said laser pulse.]

[13. A laser processing method comprising the steps of:

generating a laser pulse from a laser, said laser pulse having a pulse width duration w;

amplifying said laser pulse by activating a laser amplifier at a time t after said generating step, wherein said time t is between about 0.5 times said pulse width duration w and 5.0 times said pulse width duration w; and processing a silicon oxide film containing carbon at a concentration of 0.1 to 1% with said laser pulse.]

[14. The method of claim 13 further comprising the step of forming said silicon oxide film by chemical vapor deposition using tetraethoxysilane.]

[15. The method of claim 13 wherein said processing step comprises the step of desorbing the carbon in said silicon oxide film.]

[16. The method of claim 13 further comprising the step of activating said laser by a pulse generated by said trigger pulse generation means connected to said laser and said laser amplifier.]

[17. The method of claim 13 further comprising the step of activating said laser amplifier by a pulse generated by said trigger pulse generation means connected to said laser and said laser amplifier.]

*18. A manufacturing method of a semiconductor device comprising the steps of:*

*forming a semiconductor film over a substrate;*

*generating a laser pulse from a laser, said laser pulse having a pulse width duration w;*

*amplifying said laser pulse at a time t after said generating step, wherein said time t is between about 0.5 times said pulse width duration w and 5.0 times said pulse width duration w;*

*irradiating said semiconductor film with said amplified laser pulse to crystallize said semiconductor film; and*

*manufacturing a thin film transistor by using said semiconductor film.*

*19. The method according to claim 18 wherein said semiconductor film formed over said substrate comprises amorphous silicon.*

*20. The method according to claim 18 wherein said laser is an excimer laser.*

*21. The method according to claim 20 wherein said excimer laser is selected from $Ar_2$ laser, $Kr_2$ laser, $Xe_2$ laser, ArF laser, KrCl laser, KrF laser, XeCl laser and XeF laser.*

*22. A manufacturing method of a semiconductor device comprising the steps of:*

*forming a semiconductor film over a substrate;*

*generating a laser pulse from a laser, said laser pulse having a pulse width duration w;*

*amplifying said laser pulse at a time t after said generating step, wherein said time t is not longer than 5.0 times said pulse width duration;*

*irradiating said semiconductor film with said amplified laser pulse to crystallize said semiconductor film; and*

*manufacturing a thin film transistor by using said semiconductor film,*

*wherein said amplified laser pulse has a pulse width longer than 100 nsec.*

*23. The method according to claim 22 wherein said semiconductor film formed over said substrate comprises amorphous silicon.*

*24. The method according to claim 22 wherein said laser is an excimer laser.*

*25. The method according to claim 24 wherein said excimer laser is selected from $Ar_2$ laser, $Kr_2$ laser, $Xe_2$ laser, ArF laser, KrCl laser, KrF laser, XeCl laser and XeF laser.*

*26. A manufacturing method of a semiconductor device comprising the steps of:*

*forming a semiconductor film over a substrate;*

*generating a laser pulse from a laser, said laser pulse having a pulse width duration w;*

*amplifying said laser pulse at a time t after said generating step, wherein said time t is not longer than 5.0 times said pulse width duration;*

*irradiating said semiconductor film with said amplified laser pulse to crystallize said semiconductor film; and*

*manufacturing a thin film transistor by using said semiconductor film,*

*wherein said amplified laser pulse comprises at least first and second pulses occurring continuously, said second pulse having a higher pulse height than said first pulse.*

*27. The method according to claim 26 wherein said semiconductor film formed over said substrate comprises amorphous silicon.*

*28. The method according to claim 26 wherein said laser is an excimer laser.*

*29. The method according to claim 28 wherein said excimer laser is selected from $Ar_2$ laser, $Kr_2$ laser, $Xe_2$ laser, ArF laser, KrCl laser, KrF laser, XeCl laser and XeF laser.*

*30. A manufacturing method of a semiconductor device comprising the steps of:*

*forming a semiconductor film over a substrate;*

*generating a laser pulse from a laser, said laser pulse having a pulse width duration w;*

*amplifying said laser pulse at a time t after said generating step, wherein said time t is not longer than 5.0 times said pulse width duration;*

*irradiating said semiconductor film with said amplified laser pulse to crystallize said semiconductor film; and*

*manufacturing a thin film transistor by using said semiconductor film,*

*wherein said amplified laser pulse comprises at least first and second pulses occurring continuously, said second pulse having a higher pulse height than said first pulse,*

*wherein said laser pulse has a pulse width longer than 100 nsec.*

*31. The method according to claim 30 wherein said semiconductor film formed over said substrate comprises amorphous silicon.*

*32. The method according to claim 32 wherein said laser is an excimer laser.*

*33. The method according to claim 32 wherein said excimer laser is selected from $Ar_2$ laser, $Kr_2$ laser, $Xe_2$ laser, ArF laser, KrCl laser, KrF laser, XeCl laser and XeF laser.*

* * * * *

UNITED STATES PATENT AND TRADEMARK OFFICE

CERTIFICATE OF CORRECTION

PATENT NO. : RE41,690 E
APPLICATION NO. : 09/860499
DATED : September 14, 2010
INVENTOR(S) : Hongyong Zhang It is certified that error appears in the above-identified patent and that said Letters Patent is hereby corrected as shown below:

At column 1, line 30, change “fur” to --for--;

At column 1, line 31, change “these,” to --these--;

At column 1, line 47, change “Including” to --including--;

At column 1, line 67, change “Is” to --is--;

At column 2, line 1, change “an” to --art--;

At column 2, line 5, change “processes” to --processes.--;

At column 2, line 7, change “or” to --of--;

At column 2, line 11, change “device,” to --device;--;

At column 2, line 12, change “laid” to --said--;

At column 2, line 55, change “exalting” to --exciting--;

At column 2, line 58, change “writes a later” to --excites a laser--;

At column 3, line 3, change “width” to --which--;

At column 3, line 6, change “losing” to --lasing--;

At column 3, line 11, change “die” to --the--;

At column 3, line 13, change “pulse, in” to --pulse. In--;

At column 3, line 22, change “pulses,” to --pulses.--;

At column 3, line 23, change “Hues” to --lines--;

At column 3, line 34, change “die” to --the--;

At column 3, line 40, change “ease” to --case--;

At column 3, lines 57-58, change “crystal line” to --crystallize--;

At column 3, line 59, change “on” to --an--;

At column 3, line 63, change “it” to --is--;

Signed and Sealed this
First Day of March, 2011

David J. Kappos

David J. Kappos
*Director of the United States Patent and Trademark Office*

At column 4, line 10, change “on” to --an--;

At column 4, line 31, change “P” to --F--;

At column 4, line 44, change “lapsed” to --lased--;

At column 4, line 47, change “lapsed” to --lased--;

At column 4, line 49, change “me” to --the-- and change “it” to --is--;

At column 4, line 50, change “die” to --the--;

At column 4, line 51, change “suite” to --since--;

At column 4, line 60, change “en” to --an--;

At column 4, line 61, change “it” to --is--;

At column 5, line 1, change “widen” to --width--;

At column 5, line 8, change “lading” to --lasing--;

At column 5, line 14, change “wild” to --with--;

At column 5, lines 23-24, change “our face” to --surface--;

At column 5, line 29, change “mates” to --makes--;

At column 5, line 35, change “those” to --these--;

At column 5, line 50, change “on” to --an--;

At column 5, line 64, change “150°” to --450°--;

At column 6, line 1, change “mm” to --film--;

At column 6, line 11, change “wan” to --was--;

At column 6, line 12, change “was” to --was magnified by lenses to modify the energy density to 250 to 350 mJ/cm$^2$, preferably 280 to 320 mJ/cm$^2$. Under this condition, 5--;

At column 6, line 14, change “tho” to --the--;

At column 6, line 16, change “Silicon” to --silicon--;

At column 6, line 20, change “100179” to --100479--;

At column 6, line 58, change “condition” to --condition,--;

At column 7, line 7, change “no” to --as--;

At column 7, line 14, change “800°” to --600°--;

At column 7, line 20, change “a” to --. A-- and change “later” to --laser--;

At column 7, line 31, change “in” to --to--;

At column 7, line 44, change “tetreethoxysilane” to --tetraethoxysilane--;

At column 7, line 50, change “is” to --as--;

At column 7, line 52, change “800°” to --600°--;

At column 8, line 7, change “Using” to --lasing--;

At column 8, line 27, change “7039” to --7059--;

At column 8, line 39, change “Parent” to --Patent--;

At column 8, line 40, change “1” to --4--;

At column 8, line 45, change “80” to --60-- and change “voltages” to --voltage--;

At column 8, line 47, change “he” to --the-- and change “8” to --6--;

At column 8, line 53, change “some” to --same--;

At column 9, line 1, change “mutation” to --irradiation--; and

In claim 32 at column 12, line 20, change “claim 32” to --claim 30--.